United States Patent
Hamajima et al.

(10) Patent No.: US 10,791,626 B2
(45) Date of Patent: Sep. 29, 2020

(54) PREPREG, METAL FOIL-CLAD LAMINATE, AND PRINTED WIRING BOARD

(71) Applicant: MITSUBISHI GAS CHEMICAL COMPANY, INC., Tokyo (JP)

(72) Inventors: Tomoki Hamajima, Tokyo (JP); Meguru Ito, Tokyo (JP); Eisuke Shiga, Tokyo (JP); Yoshihiro Kato, Yamagata (JP)

(73) Assignee: MITSUBISHI GAS CHEMCIAL COMPANY, INC., Tokyo (JP)

( * ) Notice: Subject to any disclaimer, the term of this patent is extended or adjusted under 35 U.S.C. 154(b) by 362 days.

(21) Appl. No.: 14/913,766

(22) PCT Filed: Aug. 6, 2014

(86) PCT No.: PCT/JP2014/070742
§ 371 (c)(1),
(2) Date: Feb. 23, 2016

(87) PCT Pub. No.: WO2015/033731
PCT Pub. Date: Mar. 12, 2015

(65) Prior Publication Data
US 2016/0219700 A1    Jul. 28, 2016

(30) Foreign Application Priority Data

Sep. 9, 2013 (JP) ................. 2013-186307
Feb. 18, 2014 (JP) ................. 2014-028381

(51) Int. Cl.
| H05K 1/03 | (2006.01) |
| C08J 5/24 | (2006.01) |
| B29C 51/14 | (2006.01) |
| C08J 5/10 | (2006.01) |
| H05K 1/18 | (2006.01) |

(52) U.S. Cl.
CPC ........... *H05K 1/0373* (2013.01); *B29C 51/14* (2013.01); *C08J 5/10* (2013.01); *C08J 5/24* (2013.01); *H05K 1/0366* (2013.01); *H05K 1/185* (2013.01); *C08J 2300/24* (2013.01); *C08J 2379/04* (2013.01); *H05K 2201/029* (2013.01); *H05K 2201/0275* (2013.01)

(58) Field of Classification Search
CPC ...................................................... H05K 1/03
See application file for complete search history.

(56) References Cited

U.S. PATENT DOCUMENTS

| 2009/0266591 A1 | 10/2009 | Amou et al. |
| 2010/0038762 A1 | 2/2010 | Okugawa et al. |
| 2012/0009836 A1 | 1/2012 | Ueno et al. |
| 2013/0337269 A1 | 12/2013 | Ohtsuka et al. |
| 2014/0017502 A1 | 1/2014 | Kato et al. |
| 2014/0227531 A1 | 8/2014 | Ogashiwa et al. |

FOREIGN PATENT DOCUMENTS

| CN | 101570640 | 12/2011 |
| JP | 2004-149577 | 5/2004 |
| JP | 2005-054293 | 3/2005 |
| JP | 2005-213656 | 8/2005 |
| JP | 2009-231222 | 10/2009 |
| JP | 2009-263569 | 11/2009 |
| JP | 2009-263824 | 11/2009 |
| JP | 2010-031425 A | 2/2010 |
| JP | 2011-001473 A | 1/2011 |
| TW | I404752 B | 8/2013 |
| WO | 2012/099162 | 7/2012 |
| WO | 2012/121224 | 9/2012 |
| WO | 2012/165423 | 12/2012 |

OTHER PUBLICATIONS

International Search Report issued in PCT/JP2014/070742, dated Nov. 11, 2014.
International Preliminary Report On Patentability in PCT/JP2014/070742, dated Mar. 15, 2016.

*Primary Examiner* — Andrew T Piziali
(74) *Attorney, Agent, or Firm* — Greenblum & Bernstein, P.L.C.

(57) ABSTRACT

A prepreg including: a thermosetting resin composition (C) containing a thermosetting resin (A) and an inorganic filler (B); and a glass cloth (D) impregnated or coated with the thermosetting resin composition (C);
wherein the glass cloth (D) satisfies the following expressions (I) to (III), $$(x+y) \leq 95 \qquad \text{(I)}$$

$$1.9 < (X+Y)/(x+y) \qquad \text{(II)}$$

$$t < 20 \qquad \text{(III)}$$

wherein the glass cloth (D) is defined by X (threads/inch) representing number of warp yarn per inch; Y (threads/inch) representing number of weft yarn per inch; x (threads) representing number of filament per the warp yarn; y (threads) representing number of filament per the weft yarn; and t (μm) representing a thickness, and
wherein the content of the inorganic filler (B) in the thermosetting resin composition (C) is from 110 to 700 parts by mass based on 100 parts by mass of the thermosetting resin (A).

17 Claims, No Drawings

PREPREG, METAL FOIL-CLAD LAMINATE, AND PRINTED WIRING BOARD

TECHNICAL FIELD

The present invention relates to a prepreg, a metal foil-clad laminate, and a printed wiring board.

BACKGROUND ART

With respect to a printed wiring board having broad applications, such as an electronic device, a communication device, and a personal computer, the attainment of higher density, higher integration, and reduction of thickness and weight has been progressing. This trend is not limited to a monolayer printed wiring board and involves also a multilayer printed wiring board. Therefore, with respect to a core material and a build-up material to be used for a multilayer printed wiring board, there are demands for superior characteristics in terms of heat resistance, low water absorbency, moist heat resistance, insulation reliability, etc. as well as for reduction of the material thickness. Furthermore, new technique, such as a coreless technique, and a component embedding technique, have drawn attention in recent years instead of a conventional build-up technique, and also for them thickness reduction of a prepreg has been demanded.

However it has become clear that, when a thickness-reduced multilayer printed wiring board is used for a semiconductor plastic package application, disadvantage of warpage of the plastic package becomes more significant. As causes of warpage, decrease in the stiffness of a multilayer printed wiring board due to thickness reduction, and large difference between thermal expansion coefficients in the planar direction of a semiconductor device and a multilayer printed wiring board are known. Since warpage is believed to be one of causes for defective connection between a semiconductor device and a printed wiring board in a semiconductor plastic package, or between a semiconductor plastic package and a printed wiring board to be mounted, reduction of warpage has been demanded.

CITATION LIST

Patent Literature

Patent Literature 1: Japanese Unexamined Patent Application Publication No. 2009-231222
Patent Literature 2: Japanese Unexamined Patent Application Publication No. 2005-213656
Patent Literature 3: Japanese Unexamined Patent Application Publication No. 2005-054293

SUMMARY OF INVENTION

Technical Problem

As a technique for achieving reduction in the thickness of a multilayer printed wiring board, a method, by which a thin-film like resin sheet is used as a printed wiring board insulation layer, has been known (for example, refer to Patent Literature 1). However, a multilayer printed wiring board prepared by laminate molding using a film like resin sheet has a drawback in that the thermal expansion coefficient is high and the stiffness is not adequate.

Further, as a technique for achieving reduction in the thickness of a multilayer printed wiring board, a method, by which a thin glass cloth is used as a base of a prepreg for an insulation layer of a printed wiring board, has been known (for example, refer to Patent Literature 2 and 3).

The inventors have found through investigations a drawback that, when thermosetting resin composition to be impregnated in a thin glass cloth comprises a large amount of an inorganic filler for decreasing the thermal expansion coefficient of an insulation layer, and the volume content of the glass cloth accounts for more than 20% of a prepreg, a void is generated in the insulation layer made and the appearance becomes poor due to a vacant space at a cross-point of a warp and a weft (yarns) of the glass cloth.

The present invention was made in view of the above problems and an object thereof is to provide a prepreg, which is for producing a thickness-reduced printed wiring board, and has a high stiffness and a thermal expansion coefficient low in the planar direction, as well as superior appearance. Another object is to provide a metal foil-clad laminate, a printed wiring board, a multilayer printed wiring board, and a component embedded multilayer printed wiring board, which are produced with the prepreg and have high stiffness, low thermal expansivity, superior appearance, and insulation reliability despite reduced thickness.

Solution to Problem

The inventors have found that a prepreg obtained by impregnating or coating a thermosetting resin composition comprising a thermosetting resin, and an inorganic filler into a specific glass cloth, and semi-curing the same, and a metal foil-clad laminate obtained with such a prepreg can attain the objects, thereby completing the present invention.

Namely, the present invention is as follows.

[1]
A prepreg comprising: a thermosetting resin composition (C) comprising a thermosetting resin (A) and an inorganic filler (B); and a glass cloth (D) impregnated or coated with the thermosetting resin composition (C);
wherein the glass cloth (D) satisfies the following expressions (I) to (III), $$(x+y) \leq 95 \tag{I}$$

$$1.9 < (X+Y)/(x+y) \tag{II}$$

$$t < 20 \tag{III}$$

wherein the glass cloth (D) is defined by X (threads/inch) representing number of warp yarn per inch; Y (threads/inch) representing number of weft yarn per inch; x (threads) representing number of filament per the warp yarn; y (threads) representing number of filament per the weft yarn; and t (μm) representing a thickness, and
wherein the content of the inorganic filler (B) in the thermosetting resin composition (C) is from 110 to 700 parts by mass based on 100 parts by mass of the thermosetting resin (A).
[2]
The prepreg according to the above [1], wherein the content of the inorganic filler (B) is from 38 to 88 parts by mass based on 100 parts by mass of the thermosetting resin composition (C).
[3]
The prepreg according to the above [1] or [2], wherein the value of x+y in the glass cloth (D) is 50 or more.
[4]
The prepreg according to any one of the above [1] to [3], wherein the value of (X+Y)/(x+y) in the glass cloth (D) is 7.0 or less.

[5]
The prepreg according to any one of the above [1] to [4], wherein the thickness t (μm) of the glass cloth (D) is 8 μm or more.

[6]
The prepreg according to any one of the above [1] to [5], wherein when r (μm) represents as an average filament diameter of the warp yarn and the weft yarn, the thickness t (μm) of the glass cloth (D) is less than 4r.

[7]
The prepreg according to any one of the above [1] to [6], wherein an average value of the average filament diameter r (μm) of the warp yarn and the weft yarn is from 2.5 to 5.0 μm.

[8]
The prepreg according to any one of the above [1] to [7], wherein the value of X/Y of the glass cloth (D) is from 0.85 to 1.15.

[9]
The prepreg according to any one of the above [1] to [8], wherein when W (g/m$^2$) represents a mass per unit area of the glass cloth (D), the value of W/t (g/μm·m$^2$) is less than 1.0.

[10]
The prepreg according to any one of the above [1] to [9], wherein the thermosetting resin (A) comprises a cyanic acid ester compound and/or a maleimide compound.

[11]
The prepreg according to any one of the above [1] to [10], wherein the thermosetting resin (A) comprises a bismaleimide triazine resin.

[12]
The prepreg according to any one of the above [1] to [11], wherein the volume content of the glass cloth (D) in the prepreg is from 21% by volume to 35% by volume.

[13]
The prepreg according to any one of the above [1] to [12], wherein the inorganic filler (B) comprises one or more selected from the group consisting of silica, boehmite, and alumina.

[14]
A metal foil-clad laminate comprising the prepreg according to any one of the above [1] to [13], and a metal foil laminated on a single face or both faces of the prepreg.

[15]
A printed wiring board made by using the prepreg according to any one of the above [1] to [13] as a build-up material.

[16]
A multilayer printed wiring board made by using the metal foil-clad laminate according to the above [14] as a lamination material.

[17]
A component embedded multilayer printed wiring board obtained by using the prepreg according to any one of the above [1] to [13] as a build-up material, and placing a component for a semiconductor use and a metal line in a base layer.

[18]
A printed wiring board made by using the prepreg according to any one of the above [1] to [13] as an insulation layer.

Advantageous Effects of Invention

According to the present invention a prepreg, which is for producing a thickness-reduced printed wiring board, and has a high stiffness and a thermal expansion coefficient low in the planar direction, as well as superior appearance, can be provided. Further, a metal foil-clad laminate, a printed wiring board, a multilayer printed wiring board, and a component embedded multilayer printed wiring board obtained with the prepreg have despite reduced thickness high stiffness, low thermal expansivity, superior appearance, and insulation reliability.

DESCRIPTION OF EMBODIMENTS

A mode for implementing the present invention (hereinafter referred to as "present Embodiment") will be described in detail below, provided that the present invention be not limited thereto, and various alterations are possible without departing from the spirit and scope of the invention.

[Prepreg]

A prepreg according to the present Embodiment comprises:
a thermosetting resin composition (C) comprising a thermosetting resin (A) and an inorganic filler (B); and a glass cloth (D) impregnated or coated with the thermosetting resin composition (C);
wherein the glass cloth (D) satisfies the following expressions (I) to (III), $$(x+y) \leq 95 \tag{I}$$

$$1.9 < (X+Y)/(x+y) \tag{II}$$

$$t < 20 \tag{III}$$

wherein the glass cloth (D) is defined by X (threads/inch) representing number of warp yarn per inch; Y (threads/inch) representing number of weft yarn per inch; x (threads) representing number of filament per the warp yarn; y (threads) representing number of filament per the weft yarn; and t (μm) representing a thickness, and
wherein the content of the inorganic filler (B) in the thermosetting resin composition (C) is from 110 to 700 parts by mass based on 100 parts by mass of the thermosetting resin (A).

[Glass Cloth (D)]

A glass cloth (D) to be used in a prepreg of the present Embodiment satisfies the following expressions (I) to (III), $$(x+y) \leq 95 \tag{I}$$

$$1.9 < (X+Y)/(x+y) \tag{II}$$

$$t < 20 \tag{III}$$

wherein the glass cloth (D) is defined by X (threads/inch) representing number of warp yarn per inch; Y (threads/inch) representing number of weft yarn per inch; x (threads) representing number of filament per the warp yarn; y (threads) representing number of filament per the weft yarn; and t (μm) representing a thickness.

According to the present Embodiment, the warp yarn and the weft yarn are respectively made thin by selecting the number of constituent filaments of a warp yarn and a weft yarn (x+y) at 95 or less, so as to achieve thickness reduction. On the other hand, when the ratio of the number of yarns per inch of the glass cloth to the number of filaments per yarn (warp yarn, weft yarn) expressed by (X+Y)/(x+y) is made higher than 1.9, a vacant space between the yarns can be made small, and a prepreg having high stiffness and favorable appearance can be obtained despite a thin glass cloth. Further, the prepreg can provide a metal foil-clad laminate, a printed wiring board, a multilayer printed wiring board, and a component embedded multilayer printed wiring board (hereinafter collectively referred to as "metal foil-clad laminate, etc.") superior in appearance and insulation reliability.

The value of x+y of the glass cloth (D) is 95 or less, preferably 90 or less, and more preferably 80 or less. When the value of x+y is 95 or less, the thickness of a prepreg can be thinner. Meanwhile, the value of x+y of the glass cloth (D) is preferably 50 or more, more preferably 60 or more, and further preferably 80 or more. When the value of x+y is 50 or more, the appearance of a prepreg after coating tends to be improved.

The value of (X+Y)/(x+y) of the glass cloth (D) is beyond 1.9, preferably 2.0 or more, and more preferably 2.1 or more. When the value of (X+Y)/(x+y) is beyond 1.9, the stiffness and appearance of a prepreg become better. Meanwhile, the value of (X+Y)/(x+y) of the glass cloth (D) is preferably 7.0 or less, more preferably 5.0 or less, and further preferably 3.5 or less. When the value of (X+Y)/(x+y) is 7.0 or less, the stiffness of a prepreg after coating tends to be improved.

X (threads/inch) representing the number of warp yarn constituting the glass cloth (D) per inch is preferably from 70 to 105, more preferably from 80 to 105, and further preferably from 85 to 100. When the number X of warp yarn is within the range, a prepreg providing thinner and higher stiffness metal foil-clad laminate, etc. tends to be obtained.

Y (threads/inch) representing the number of weft yarn constituting the glass cloth (D) per inch is preferably from preferably 70 to 105, more preferably from 80 to 105, and further preferably from 90 to 105. When the number Y of weft yarn is within the range, a prepreg providing thinner and higher stiffness metal foil-clad laminate, etc. tends to be obtained.

x (threads) representing the number of filaments per the warp yarn constituting the glass cloth (D) is preferably from 25 to 50, more preferably from 30 to 45, and further preferably from 35 to 45. When the filament number x is within the range, a prepreg providing thinner and higher stiffness metal foil-clad laminate, etc. tend to be obtained.

y (threads) representing the number of filaments per the weft yarn constituting the glass cloth (D) is preferably from 25 to 50, more preferably from 30 to 50, and further preferably from 40 to 50. When the filament number y (threads) is within the range, a prepreg providing thinner and higher stiffness metal foil-clad laminate, etc. tends to be obtained.

Further, the value of X+Y of the glass cloth (D) is preferably from 140 to 220, more preferably from 160 to 200, and further preferably from 170 to 200. When the value of X+Y is 140 or more the stiffness tends to be improved. Meanwhile, when the value of X+Y is 220 or less, a thinner prepreg and a thinner metal foil-clad laminate, etc. tend to be obtained.

The value of X/Y representing the ratio of the number of warp yarns per inch to the same of weft yarns of the glass cloth (D) is preferably from 0.85 to 1.15, and more preferably from 0.98 to 1.10. When the value of X/Y is within the range, the stability of physical characteristics, such as a dimensional behavior, a thermal expansion coefficient, and warpage, in the longitudinal direction and the width direction during heating tends to be improved.

The thickness t (μm) of the glass cloth (D) is less than 20 μm, preferably 16 μm or less, and more preferably 14 μm or less. When the thickness t is less than 20 μm, a thinner prepreg can be obtained, and a metal foil-clad laminate, etc. can be also made thinned. Meanwhile, the thickness t is preferably 8 μm or more. When the thickness t is 8 μm or more, the stiffness tends to be improved.

If an average filament diameter of a warp yarn and a weft yarn of the glass cloth (D) is represented as r (μm), the thickness t (μm) of the glass cloth (D) is preferably less than 4r, more preferably from 2.0r to 3.5r, and further preferably from 2.0r to 3.0r. When the thickness t is less than 4r, a thinner prepreg and a thinner metal foil-clad laminate, etc. tend to be obtained.

An average value of the average filament diameter r (μm) of the warp yarn and the weft yarn is preferably from 2.5 to 5.0 μm, more preferably from 3.5 to 4.5 μm, and further preferably from 3.5 to 4.2 μm. When the average value of the average filament diameter r (μm) of the warp yarn and the weft yarn is within the range, a thinner prepreg and a thinner metal foil-clad laminate, etc. tend to be obtained.

If the mass of the glass cloth (D) per unit area is represented as W (g/m$^2$), the value of W/t (g/μm·m$^2$) is preferably less than 1.0, more preferably from 0.7 to 0.95, and further preferably from 0.85 to 0.95. When the value of W/t (g/μm·m$^2$) is less than 1.0, the appearance of a prepreg, and metal foil-clad laminate, etc. obtained therewith tend to be improved, and therefore the yield tends to be improved.

The value of W (g/m$^2$) is preferably from 8.0 to 20.0 g/m$^2$, more preferably from 9.0 to 13.5 g/m$^2$, and further preferably from 9.8 to 12.8 g/m$^2$. When the value of W (g/m$^2$) is within the range, a thinner prepreg and thinner metal foil-clad laminate, etc. tend to be obtained.

There is no particular restriction on a glass fiber constituting the glass cloth (D), and publicly known fibers used for various printed wiring board materials may be used. Although there is no particular restriction on such glass fibers, examples thereof include glass fibers from E-glass, D-glass, C-glass, S-glass, NE-glass, T-glass, and Q-glass.

The glass cloth (D) may be produced, for example, but not limited to, by a production method including a yarn-making step, where a predetermined number of filaments with a predetermined diameter are bound to make a warp yarn and a weft yarn, and a weaving step, where the warp yarn and weft yarn were woven to satisfy the expressions (I) to (III)

In a yarn-making step, a sizing agent may be applied to filaments according to the publicly known method. Examples of the publicly known method for applying the sizing agent include dip coating, roller coating, blow coating, flow coating and spray coating. The sizing agent may be the publicly known sizing agent, and is preferably a so-called glass fiber sizing agent.

The weaving step may be carried out using the publicly known loom. Specific examples thereof include methods for weaving the glass fiber using a jet loom (such as an air jet loom, and a water-jet loom), a Sulzer loom, and a Rapier loom. Examples of a weaving method of the glass cloth include plain weaving, satin weaving, basket weaving, twill weaving, diagonal weaving, leno weaving, tri-axial weaving, and horizontal stripe weaving. Examples of the knitting method of the knit include weft knitting, such as plain stitching, rib stitching, and purl stitching, and warp knitting, such as single denbigh stitching, single cord stitching, and two needle stitching, as well as lace stitching, float stitching, and pile stitching. For knitting, a weft knitting machine, which per se is publicly known, such as a latch needle plain fabric circular knitting machine, a circular knitting machine, and a Cotton's straight-bar machine, or a warp knitting machine may be used.

The glass cloth (D) may be used as greige without removing the sizing agent applied as above, or may be used after performing the widely known technology for removing the applied sizing agent, such as a heat cleaning treatment, a coronizing treatment, and a hot-water washing treatment.

The glass cloth having received a heat cleaning treatment, a coronizing treatment, or a hot-water washing treatment may be subjected to a surface treatment with the publicly known surface preparation agent. There is no particular restriction on such a surface treatment means, and examples thereof include impregnation, coating, and spraying of a surface preparation agent.

[Thermosetting Resin Composition (C)]

A thermosetting resin composition (C) of the present Embodiment comprises a thermosetting resin (A) and an inorganic filler (B).

[Thermosetting Resin (A)]

There is no particular restriction on a thermosetting resin (A), insofar as it is a thermally curable resin, and examples thereof include cyanic acid ester compounds, a maleimide compounds, a bismaleimide triazine resins (BT resin), a halogen-free epoxy resins, a phenolic resins, and poly(phenylene ether). Among them, the cyanic acid ester compounds, and/or the maleimide compounds are preferable. When the cyanic acid ester compounds and/or the maleimide compounds are used, the chemical resistance, and adherence tend to be improved. BT resins are also preferable. When The BT resins are contained, the chemical resistance, adherence, moisture absorption resistance, and heat resistance tend to be improved. The thermosetting resins (A) may be used singly or in combinations of two or more thereof.

The content of the thermosetting resin (A) is preferably from 7.0 to 62 parts by mass based on 100 parts by mass of the thermosetting resin composition (C), more preferably from 10 to 55 parts by mass, and further preferably from 10 to 45 parts by mass. When the content of the thermosetting resin (A) is 7.0 parts by mass or more, the moldability of the thin prepreg tends to be improved. Meanwhile, when the content of the thermosetting resin (A) is 62 parts by mass or less, the stiffness tends to be improved.

(Cyanic Acid Ester Compound)

There is no particular restriction on the cyanic acid ester compounds, and examples thereof include the naphthol aralkyl-based cyanic acid ester compounds represented by the following formula (1), a novolac-based cyanic acid ester compounds represented by the following formula (2), a biphenyl aralkyl-based cyanic acid ester compounds, bis(3,5-dimethyl4-cyanatophenyl)methane, bis(4-cyanatophenyl) methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone, and 2,2-bis(4-cyanatophenyl)propane. Among them, the naphthol aralkyl-based cyanic acid ester compounds represented by the following formula (1), a novolac-based cyanic acid ester compounds represented by the following formula (2), and a biphenyl aralkyl-based cyanic acid ester compounds are preferable. When the naphthol aralkyl-based cyanic acid ester compounds represented by the following formula (1), the novolac-based cyanic acid ester compounds represented by the following formula (2), and the biphenyl aralkyl-based cyanic acid ester compounds are used, the flame resistance and curability tend to be improved, and the thermal expansion coefficient of a cured product tends to be decreased. The cyanic acid ester compounds may be used singly or in combinations of two or more thereof.

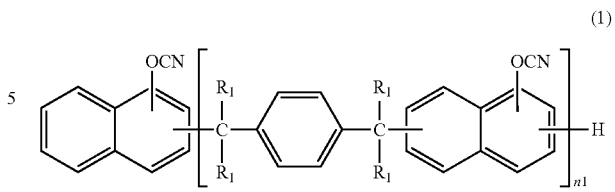

(1)

(In the formula (1), each $R_1$ independently represents a hydrogen atom or a methyl group, and between the two a hydrogen atom is preferable. Further, in the formula (1), n1 is an integer of 1 or higher. The upper limit of n1 is ordinarily 10, and preferably 6.)

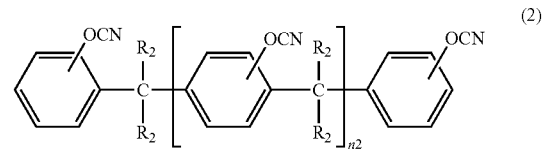

(2)

(In the formula (2), each $R_2$ independently represents a hydrogen atom or a methyl group, and between the two a hydrogen atom is preferable. Further, in the formula (2), n2 is an integer of 1 or higher. The upper limit of n2 is ordinarily 10, and preferably 7.)

There is no particular restriction on a production method for the cyanic acid ester compounds, and the publicly known cyanic acid ester synthesis method, such as the production method for the naphthol aralkyl-based cyanic acid ester compounds according to Japanese Patent No. 4407823, may be applied. Further, examples of the commercial product of the novolac-based cyanic acid ester compounds include PT-30 (Lonza Japan Ltd.).

When the thermosetting resin composition (C) comprises a cyanic acid ester compound and/or a halogen-free epoxy resin, the ratio (CN/Ep) of the number of cyanate groups in the cyanic acid ester compound to the number of epoxy groups in the halogen-free epoxy resin is preferably from 0.70 to 2.5, further preferably from 0.70 to 1.5, and further preferably from 0.75 to 1.25. When the ratio (CN/Ep) is within the range, the heat resistance and flame resistance of a prepreg, metal foil-clad laminate, etc. tend to be improved, and the water absorption tends to be decreased.

When the thermosetting resin (A) comprises the cyanic acid ester compound, from viewpoints of curability and heat resistance the content of the cyanic acid ester compound is preferably from 10 to 60 parts by mass based on the total amount of the thermosetting resin (A) as 100 parts by mass, more preferably from 20 to 50 parts by mass, and further preferably from 25 to 45 parts by mass.

(Maleimide Compound)

There is no particular restriction on the maleimide compound, insofar as it is a compound having 1 or more maleimide groups in a molecule. Specific examples thereof include N-phenylmaleimide, N-hydroxyphenylmaleimide, bis(4-maleimidophenyl)methane, 2,2-bis[4-(4-maleimidophenoxy)-phenyl]propane, bis(3,5-dimethyl-4-maleimidophenyl)methane, bis(3-ethyl-5-methyl-4-maleimidophenyl)methane, bis(3,5-diethyl-4-maleimidophenyl)methane, the maleimide compounds represented by the following formula (3), and a prepolymer of the maleimide compound, or a prepolymer of the maleimide compound and an amine compound. Among them, bis(4-maleimidophenyl)methane, 2,2-bis[4-(4-maleimidophenoxy)-phenyl]propane, bis(3-ethyl-5-methyl-4-maleimidophenyl)methane, and a maleimide compound represented by the following formula (3) are preferable, and especially a maleimide compound represented by the following formula (3) is preferable. The maleimide compounds may be used singly or in combinations of two or more thereof.

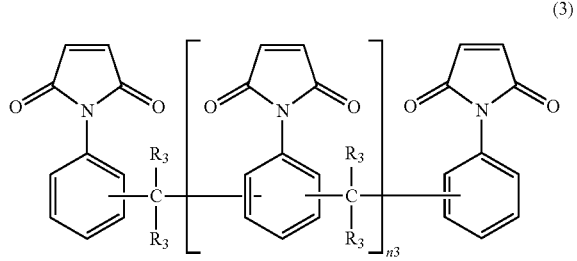

(3)

(In the formula (3), $R_3$ represents a hydrogen atom or a methyl group, and between the two a hydrogen atom is preferable. In the formula (3), n3 is an integer of 1 or higher. The upper limit of n3 is ordinarily 10, and preferably 7.)

When the thermosetting resin (A) comprises a maleimide compound, from viewpoints of curability and heat resistance the content of a maleimide compound is preferably from 3.0 to 50 parts by mass based on the total amount of the thermosetting resin (A) as 100 parts by mass of, more preferably from 5.0 to 40 parts by mass, and further preferably from 10 to 40 parts by mass.

(BT Resin)

There is no particular restriction on the BT resin, and examples thereof include those obtained by polymerization, for example, by mixing with heating a cyanic acid ester compound and a maleimide compound without a solvent, or as dissolved in an organic solvent such as methyl ethyl ketone, N-methylpyrrolidone, dimethylformamide, dimethylacetamide, toluene, and xylene.

There is no particular restriction on the cyanic acid ester compounds to be used as a source material for the BT resin, and examples thereof include the naphthol aralkyl-based cyanic acid ester compounds represented by the formula (1), the novolac-based cyanic acid ester compounds represented by the formula (2), a biphenyl aralkyl-based cyanic acid ester compound, bis(3,5-dimethyl4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone, and 2,2'-bis(4-cyanatophenyl) propane. Among them, the naphthol aralkyl-based cyanic acid ester compounds represented by the formula (1), the novolac-based cyanic acid ester compound represented by the formula (2), and the biphenyl aralkyl-based cyanic acid ester compound are preferable. When the naphthol aralkyl-based cyanic acid ester compounds represented by the formula (1), the novolac-based cyanic acid ester compounds represented by the formula (2), or the biphenyl aralkyl-based cyanic acid ester compound is used, the flame resistance and curability of a prepreg, and metal foil-clad laminate, etc. are improved and the thermal expansion coefficient tends to be lowered.

There is no particular restriction on the maleimide compounds to be used as a source material for the BT resin, and examples thereof include N-phenylmaleimide, N-hydroxyphenylmaleimide, bis(4-maleimidophenyl)methane, 2,2-bis[4-(4-maleimidophenoxy)-phenyl]propane, bis(3,5-dimethyl-4-maleimidophenyl)methane, bis(3-ethyl-5-methyl-4-maleimidophenyl)methane, bis(3,5-diethyl-4-maleimidophenyl)methane, the maleimide compounds represented by the formula (3), a prepolymer of the maleimide compound or a prepolymer of the maleimide compound and an amine compound. Among them, bis(4-maleimidophenyl)methane, 2,2-bis[4-(4-maleimidophenoxy)-phenyl]propane, bis(3-ethyl-5-methyl-4-maleimidophenyl)methane, and a maleimide compound represented by the formula (3) are preferable, and especially a maleimide compound represented by the formula (3) is preferable.

Although there is no particular restriction on the percentage of the maleimide compound to be used as a source material for the BT resin, from viewpoints of the glass transition temperature, flame resistance, and curability it is preferably from 5.0 to 75% by mass based on the total amount of the BT resin as 100% by mass, more preferably from 10 to 70% by mass, and further preferably from 20 to 65% by mass.

Although there is no particular restriction on the number average molecular weight of the ST resin as a prepolymer, from viewpoints of the handling property, glass transition temperature, and curability it is preferably from 100 to 100,000, more preferably from 500 to 80,000, and further preferably from 1,000 to 60,000.

In a case in which the thermosetting resin (A) comprises the BT resin, the content of the BT resin is from viewpoints of the curability and heat resistance preferably from 20 to 80 parts by mass based on the total amount of the thermosetting resin (A) as 100 parts by mass, more preferably from 30 to 70 parts by mass, and further preferably from 35 to 65 parts by mass. When the content of the BT resin is within the range, there is a tendency that the degree of cure, flame resistance, and glass transition temperature of a prepreg, metal foil-clad laminate, etc. are improved, the water absorption is decreased, and the elastic modulus becomes superior.

(Halogen-Free Epoxy Resin)

There is no particular restriction on the halogen-free epoxy resin, insofar as it is a compound having 2 or more epoxy groups in a molecule, and not having a halogen atom in a molecular framework. Examples thereof include phenol phenyl aralkyl novolac-based epoxy resins represented by the following formula (4), phenol biphenyl aralkyl-based epoxy resins represented by the following formula (5), naphthol aralkyl-based epoxy resins represented by the following formula (6), anthraquinone-based epoxy resins represented by the following formula (7), polyoxynaphthylene-based epoxy resins represented by the following formula (8) or the following formula (9), bisphenol A-based epoxy resins, bisphenol F-based epoxy resins, phenol novolac-based epoxy resins, cresol novolac-based epoxy resins, bisphenol A novolac-based epoxy resins, tri-functional phenol-based epoxy resins, tetra-functional phenol-based epoxy resins, naphthalene-based epoxy resins, biphenyl-based epoxy resins, aralkyl novolac-based epoxy resins, brominated bisphenol A-based epoxy resins, brominated phenol novolac-based epoxy resins, phosphorus-containing epoxy resins, alicyclic epoxy resins, polyol-based epoxy resins, glycidyl amines, glycidyl esters, compounds obtained by epoxidizing a double bond of butadiene, etc. and compounds obtained by a reaction of a hydroxy group-containing silicone resins and epichlorohydrin. Among them, from viewpoints of improvement of flame resistance and reduction of heat expansion, the phenol phenyl aralkyl novolac-based epoxy resins represented by the following formula (4), the phenol biphenyl aralkyl-based epoxy resins represented by the following formula (5), the naphthol aralkyl-based epoxy resins represented by the following formula (6), the anthraquinone-based epoxy resins represented by the following formula (7), and the polyoxynaphthylene-based epoxy resins represented by the following formula (8) or the following formula (9) are preferable. The halogen-free epoxy resins may be used singly or in combinations of two or more thereof.

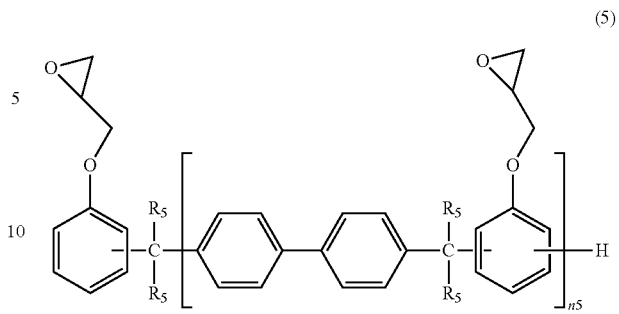

(5)

(In the formula (5), $R_5$ represents a hydrogen atom or a methyl group, and between the two a hydrogen atom is preferable. In the formula (5), n5 is an integer of 1 or higher. The upper limit of n5 is ordinarily 10, and preferably 7.)

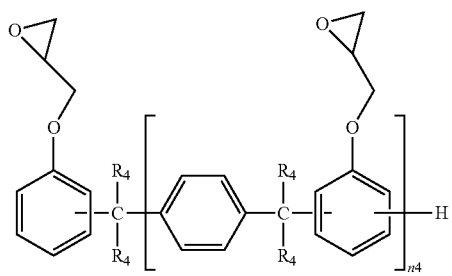

(4)

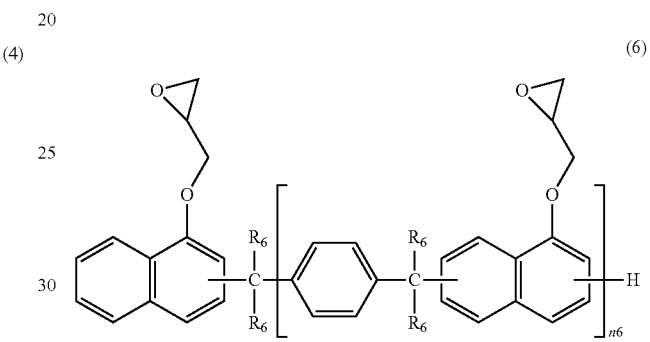

(6)

(In the formula (4), $R_4$ represents a hydrogen atom or a methyl group, and between the two a hydrogen atom is preferable. In the formula (4), n4 is an integer of 1 or higher. The upper limit of n4 is ordinarily 10, and preferably 7.)

(In the formula (6), $R_6$ represents a hydrogen atom or a methyl group, and between the two a hydrogen atom is preferable. In the formula (6), n6 is an integer of 1 or higher. The upper limit of n6 is ordinarily 10, and preferably 7.)

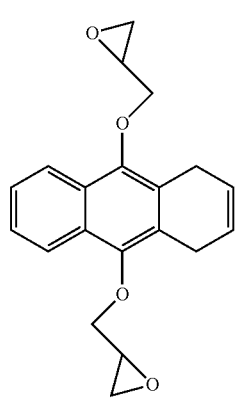

(7)

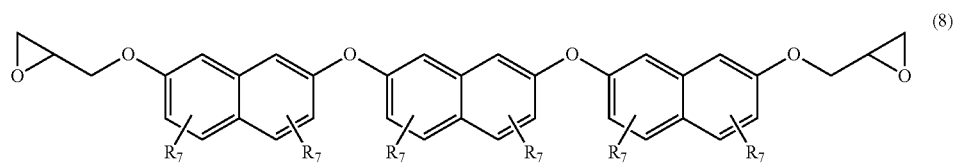

(8)

(In the formula (8), each $R_7$ independently represents a hydrogen atom or a C1 to C4 alkyl group, or an aralkyl group.)

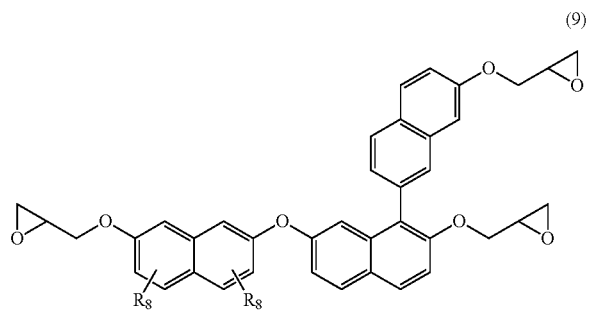

(9)

(In the formula (9), each $R_8$ independently represents a hydrogen atom or a C1 to C4 alkyl group, or an aralkyl group.)

For the polyoxynaphthylene-based epoxy resin represented by the formula (8) or the formula (9), a commercial product may be used. Examples of the product include EXA-7311, EXA-7311-G3, EXA-7311-G4, EXA-7311-G4S, EXA-7311L, and HP-6000 produced by DIC Corporation.

When the thermosetting resin (A) comprises the halogen-free epoxy resin, the content of the halogen-free epoxy resin is from a viewpoint of adhesion strength with a metal foil preferably from 5.0 to 90 parts by mass based on the total amount of the thermosetting resin (A) as 100 parts by mass, more preferably from 20 to 70 parts by mass, and further preferably from 30 to 70 parts by mass.

(Phenol Resin)

There is no particular restriction on the type of the phenol resin, insofar as it is a resin having 2 or more phenolic hydroxy groups in a molecule, and the publicly known one may be used appropriately. Examples of thereof include cresol novolac-based phenol resins, a phenol novolac resins, alkylphenol novolac resins, bisphenol A-based novolac resins, dicyclopentadiene-based phenol resins, Zylock-based phenol resins, terpene-modified phenol resins, polyvinylphenols, naphthol aralkyl-based phenol resins, biphenyl aralkyl-based phenol resins, naphthalene-based phenol resins, and amino triazine novolac-based phenol resins. The phenol resins may be used singly or in combinations of two or more thereof.

When the thermosetting resin (A) comprises a phenol resin, the content of a phenol resin is from a viewpoint of heat moldability preferably from 10 to 90 parts by mass based on the total amount of the thermosetting resin (A) as 100 parts by mass, more preferably from 15 to 70 parts by mass, and further preferably from 20 to 65 parts by mass.

[Poly(Phenylene Ether)]

There is no particular restriction on poly(phenylene ether), and the publicly known one may be used, insofar as it is, for example, a polymer comprising at least a structural unit represented by the following formula (10).

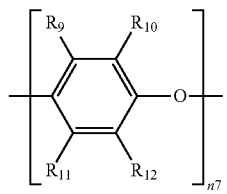

(10)

(In the formula (10), $R_9$, $R_{10}$, $R_{11}$ and $R_{12}$ independently represent a C6 or less alkyl group, an aryl group, halogen or hydrogen. Further, in the formula (10), n7 is an integer of 1 or higher.)

As poly(phenylene ether), a modified poly(phenylene ether), which is partly or totally functionalized with an ethylenic unsaturated group such as a vinylbenzyl group, an epoxy group, an amino group, a hydroxy group, a mercapto group, a carboxy group, and a silyl group, may be used. The modified polymers may be used singly or in combinations of two or more thereof. Examples of poly(phenylene ether) having a terminal hydroxy group include SA90 produced by SABIC Innovative Plastics Japan LLC.

Poly(phenylene ether) includes preferably a modified poly(phenylene ether) having ethylenic unsaturated groups at both the ends. There is no particular restriction on an ethylenic unsaturated group, and examples thereof include an alkenyl group, such as an ethenyl group, an allyl group, an acrylic group, a methacrylic group, a propenyl group, a butenyl group, a hexenyl group, and an octenyl group; a cycloalkenyl group, such as a cyclopentenyl group, and a cyclohexenyl group; and an alkenylaryl group, such as a vinylbenzyl group, and a vinylnaphthyl group. Among them, a vinylbenzyl group is preferable. The two ethylenic unsaturated groups at both the ends may be the same or different functional groups. Such poly(phenylene ether) may be, for example, OPE-2St produced by Mitsubishi Gas Chemical Co., Inc.

There is no particular restriction on a production method for a modified poly(phenylene ether), insofar as the method is publicly known. For example, that functionalized with a vinylbenzyl group may be produced by dissolving a bifunctional phenylene ether oligomer and vinylbenzyl chloride in a solvent, adding a base with heating and stirring to react them, and solidifying a resin. For example, that functionalized with a carboxy group may be produced by melt-kneading an unsaturated carboxy acid or a functionalized derivative thereof with poly(phenylene ether) allowing to react together in the presence or in the absence of a radical initiator. Alternatively, the same may be produced by dissolving poly(phenylene ether) and an unsaturated carboxylic acid or a functionalized derivative thereof in the presence or in the absence of a radical initiator, in an organic solvent allowing to react together in the solution.

In a case in which the thermosetting resin (A) comprises poly(phenylene ether), the content of poly(phenylene ether) is from a viewpoint of electrical property preferably from 10 to 90 parts by mass based on the total amount of the thermosetting resin (A) as 100 parts by mass, more preferably from 20 to 85 parts by mass, and further preferably from 30 to 85 parts by mass.

[Inorganic Filler (B)]

Examples of the inorganic filler (B) in the thermosetting resin composition (C) include silica, such as natural silica, fused silica, amorphous silica, and hollow silica; boehmite; a molybdenum compound, such as molybdenum oxide, and zinc molybdate; alumina; talc; fired talc; mica; short glass fiber; and spherical glass (glass fine powder of E-glass, T-glass, D-glass, etc.). Among them, the inorganic filler (B) comprises preferably one or more selected out of the group consisting of silica, boehmite, and alumina. When such the inorganic filler (B) is used, there is a tendency that the warpage is reduced, and the stiffness is improved. The inorganic fillers (B) may be used singly or in combinations of two or more thereof.

Although there is no particular restriction on the average particle size (D50) of the inorganic filler (B), it is from viewpoints of use in a thin multilayer printed wiring board and dispersibility preferably from 10 nm to 8.0 μm, more preferably from 100 nm to 5.0 μm, and further preferably from 100 nm to 3.0 μm. In this regard, the average particle size (D50) means a median diameter, namely a diameter at which a larger portion and a smaller portion contain the same amount, when the particle size distribution measured with respect to a powder is divided into two portions. More specifically, an average particle size (D50) means a value in a particle size distribution measured by a laser diffraction scattering particle size distribution analyzer for a powder dispersed in methyl ethyl ketone, at which the volume cumulated from the smaller particle diameter side reaches 50% of the total volume.

The content of the inorganic filler (B) in the thermosetting resin composition (C) is from viewpoints of favorable thermal expansion coefficient and appearance of an obtained prepreg from 110 parts by mass to 700 parts by mass based on 100 parts by mass of the thermosetting resin (A), preferably from 120 to 420 parts by mass, and more preferably from 20 to 420 parts by mass.

Meanwhile, the content of the inorganic filler (B) is preferably from 38 to 88 parts by mass based on 100 parts by mass of the thermosetting resin composition (C), more preferably from 45 to 80 parts by mass, and further preferably from 55 to 70 parts by mass. When the content of the inorganic filler (B) is 38 parts by mass or more, the stiffness of a prepreg to be obtained tends to be improved. Meanwhile, when the loading amount of the inorganic filler (B) in the thermosetting resin composition (C) is increased, generally the stiffness of a prepreg is improved but the productivity is impaired extremely. However, according to the present invention by using the glass cloth (D) having the above characteristics, even when the inorganic filler (B) is highly loaded (for example, 55 parts by mass or more), a high stiffness prepreg may be produced easily without impairing the productivity of a prepreg.

[Silane Coupling Agent]

The thermosetting resin composition (C) may contain, if necessary, a silane coupling agent. There is no particular restriction on a silane coupling agent, insofar as it is a silane coupling agent used generally for a surface treatment of an inorganic substance, and examples thereof include aminosilane compounds, such as γ-aminopropyltriethoxysilane, and N-β-(aminoethyl)-γ-aminopropyltrimethoxysilane; epoxy silane compounds such as γ-glycidoxypropyltrimethoxysilane; vinyl silane compounds such as γ-methacryloxypropyltrimethoxysilane; cationic silane compounds such as N-β-(N-vinylbenzylaminoethyl)-γ-aminopropyltrimethoxysilane hydrochloride; and a phenylsilane compound. The silane coupling agents may be used singly or in combinations of two or more thereof.

[Wetting and Dispersing Agent]

The thermosetting resin composition (C) may contain, if necessary, a wetting and dispersing agent. There is no particular restriction on the wetting and dispersing agent, and a dispersion stabilizer used for a paint may be used. Examples thereof include DISPERBYK-110, 111, 180, 161, 2000, 2151, BYK-W996, W9010, W903, etc. produced by BYK Japan KK.

[Curing Promoter]

The thermosetting resin composition (C) may contain, if necessary, a curing promoter in addition to the thermosetting resin (A) and the inorganic filler (B). There is no particular restriction on a curing promoter, and examples thereof include imidazole compounds; organic peroxides, such as benzoyl peroxide, lauroyl peroxide, acetyl peroxide, para-chlorobenzoyl peroxide, and di-tert-butyl-di-perphthalate; azo compounds such as azobisnitrile; tertiary-amines, such as N,N-dimethyl(benzyl)amine, N,N-dimethylaniline, N,N-dimethyltoluidine, 2-(N-ethyl)anilinoethanol, tri-n-butylamine, pyridine, quinoline, N-methylmorpholine, triethanolamine, triethylenediamine, tetramethylbutanediamine, and N-methylpiperidine; phenols, such as phenol, xylenol, cresol, resorcinol, and catechol; organic metal salts, such as lead naphthenate, lead stearate, zinc naphthenate, zinc octoate, tin oleate, dibutyltin maleate, manganese naphthenate, cobalt naphthenate, and iron acetylacetonate; products obtained by dissolving such an organic metal salt in a hydroxy-group containing compound, such as phenol, and bisphenol; inorganic metal salts, such as tin chloride, zinc chloride, and aluminum chloride; and organic tin compounds, such as dioctyltin oxide, another alkyl tin, and an alkyl tin oxide.

As the imidazole compound those represented by the following formula (11) are preferable from a viewpoint of raising the glass transition temperature of cured products.

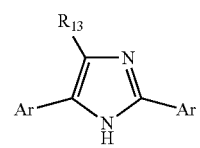

(11)

(In the formula (11), Ar represents a phenyl group, a naphthyl group, a biphenyl group, an anthranilic group, or a hydroxy group-modified product of the same, and among them a phenyl group is preferable. Further, in the formula (11), $R_{13}$ represents a hydrogen atom, an alkyl group or a hydroxy group-modified product of the same, or an aryl group such as a phenyl group. Among various combinations of the two, especially preferably Ar, and $R_{13}$ are both phenyl groups.)

In a case in which the imidazole compounds are used for the thermosetting resin composition (C) of the present Embodiment, the content of the imidazole compounds is from viewpoints of curability and heat resistance preferably from 0.010 to 10 parts by mass based on the total amount of the thermosetting resin (A) as 100 parts by mass, more preferably from 0.10 to 5.0 parts by mass, and further preferably from 0.10 to 2.5 parts by mass. When the content of the imidazole compounds is within the range, the viscosity of a prepreg can be made in an appropriate range, and favorable moldability tends to be obtained. Further, with respect to the printed wiring board to be obtained, there is a tendency that the degree of cure is enhanced, and the flame resistance, glass transition temperature, and elastic modulus become superior.

[Solvent]

The thermosetting resin composition (C) may, if necessary, contain a solvent. For example, if the organic solvents are used, the viscosity of the thermosetting resin composition during preparation is lowered, so that the handling property is improved, and also the impregnation property into the glass cloth tends to be improved. Although there is no particular restriction on the solvent, the solvent which can dissolve the thermosetting resin (A) is preferable. There is no particular restriction on such solvents, and examples thereof include ketones, such as acetone, methyl ethyl ketone, and methyl cellosolve; aromatic hydrocarbons, such as toluene, and xylene; amides such as dimethyl formamide; propylene glycol methyl ethers; and acetates of the same. The solvents may be used singly or in combinations of two or more thereof.

[Additive]

The thermosetting resin composition (C) may contain, if necessary, various polymers, such as thermoplastic resins, and oligomers or an elastomers thereof; another flame resistant compounds; another additives, and the like. There is no particular restriction on the aforedescribed substances, insofar as they are used generally for the thermosetting resin composition. Examples of a flame resistance compound include nitrogen-containing compounds, such as melamines and benzoguanamines; and oxazine ring-containing compounds. Examples of other additives include UV absorbers, antioxidants, photopolymerization initiators, fluorescent whitening agents, photosensitizers, dyes, pigments, thickeners, slip additives, defoaming agents, dispersing agents, leveling agents, glazing agents, and polymerization inhibitors. The additives may be used singly or in combinations of two or more thereof.

[Production Method for Prepreg]

There is no particular restriction on a production method for the prepreg according to the present Embodiment, insofar as it is a production method for the prepreg by impregnating or coating the thermosetting resin composition (C) comprising the thermosetting resin (A) and the inorganic filler (B) into the glass cloth (D). Examples thereof include the production method for the prepreg, by which a resin varnish comprising the thermosetting resin composition (C) is impregnated or coated into the glass cloth (D) and heated in a dryer at from 100 to 200° C. for 1 to 60 min for semi-curing.

The volume content of the glass cloth in the prepreg of the present Embodiment is preferably from 21% by volume to 35% by volume, more preferably from 22% by volume to 31% by volume, and further preferably from 23% by volume to 29% by volume. When the volume content is 21% by volume or more, a reduction effect on the thermal expansion coefficient and an enhancing effect on the stiffness tend to be intensified. Meanwhile, when the volume content is 35% by volume or less, the moldability is improved and the moist heat resistance and insulation reliability tend to be improved.

A volume content of the glass cloth in the prepreg is calculated from a fully cured platy product (insulation layer) of a metal foil-clad laminate, etc. made from the prepreg. When t1 (μm) represents the thickness of an insulation layer of a metal foil-clad laminate, W (g/m$^2$) as the mass of the glass cloth in the insulation layer, d (g/cm$^3$) as the specific gravity thereof, and S (sheet) as the number of glass cloths contained in the laminate, the volume content is calculated according to the following expression.

Volume content (%)=((t1−W/d)×S)/t1×100

[Metal Foil-Clad Laminate]

A metal foil-clad laminate of the present Embodiment includes the prepreg, and a metal foil layered on a single face or both faces of the prepreg. Such a metal foil-clad laminate may be produced by layering at least one sheet of the prepreg, and placing and laminating a metal foil on a single face or both faces of the same. Specifically, a sheet, or 2 or more sheets of the prepreg are stacked, and a metal foil of copper, aluminum, or the like is placed on a single face or both faces of the prepreg according to a desired constitution, which are then laminated according to need to make a metal foil-clad laminate of the present Embodiment. In this regard, the prepreg other than the aforedescribed prepreg may be used in combination.

There is no particular restriction on a metal foil to be used as above, insofar as it is used as a printed wiring board material, and the publicly known copper foil, such as a rolled copper foil and an electrolytic copper foil, is preferable. Further, there is no particular restriction on the thickness of a metal foil. However it is preferably from 2 to 70 μm, and more preferably from 2 to 35 μm. In this regard, instead of a metal foil, a copper foil with a resin may be also used.

There is also no particular restriction on a molding method for a metal foil-clad laminate and a molding condition thereof, and a general technique and condition for a laminate and a multilayer plate for a printed wiring board may be applied. For example, in molding a metal foil-clad laminate, a multistage press, a multistage vacuum press, a continuous molding machine, or an autoclave molding machine may be used. Generally, the molding temperature is from 100 to 300° C., the molding pressure is in terms of surface pressure from 2 to 100 kgf/cm$^2$, and the heating time is from 0.05 to 5 hours. Further, if necessary, post curing may be carried out at a temperature from 150 to 300° C. Also it is possible that the prepreg of the present Embodiment is laminated in combination with a wiring board for an inner layer made separately to form a multilayer plate.

A metal foil-clad laminate produced using the prepreg of the present Embodiment has a low thermal expansion coefficient, and favorable moldability and chemical resistance, and can be used especially effectively as a material for a semiconductor plastic package requiring high reliability with a small thickness.

[Printed Wiring Board, Multilayer Printed Wiring Board, and Component Embedded Multilayer Printed Wiring Board]

A printed wiring board of the present Embodiment is made using the prepreg as a build-up material. Such a printed wiring board can be obtained by forming a predetermined wiring pattern on the metal foil-clad laminate. Further, a multilayer printed wiring board of the present Embodiment is made using the metal foil-clad laminate as a lamination material. Such a multilayer printed wiring board can be obtained by forming a multilayer printed wiring board using the metal foil-clad laminate of the present Embodiment as a lamination material. Further, a component embedded multilayer printed wiring board of the present Embodiment can be obtained by using the prepreg as a build-up material and placing a component for a semiconductor use and a metal line on a base layer.

In this regard, the term "build-up" means to layer the prepreg or a resin sheet one on another, and also to repeat hole formation and wiring formation layer by layer, so as to produce a multilayer-structured printed wiring board.

A printed wiring board of the present Embodiment may be made such that the prepreg is formed as an insulation layer. In this regard, in any case, various process steps (for example, a hole formation processing for a via hole, a through-hole, etc.) may be added, if necessary.

A printed wiring board and a multilayer printed wiring board can be produced, for example, by the following method. First of all, a metal foil-clad laminate such as a copper-clad laminate, etc. of the present Embodiment is prepared. An inner layer substrate is made by forming an inner layer circuit by conducting various circuit forming steps such as an etching treatment on a surface of the metal foil-clad laminate. If necessary, a surface treatment for enhancing the adhesive strength is rendered to an inner layer circuit surface of the inner layer substrate, then a required number of prepregs comprising 1 or more prepregs of the present Embodiment are stacked on the inner layer circuit surface, a metal foil, etc. for an outer layer circuit is further layered on the outer surface thereof, and heat and pressure are applied to unite the stack by molding. Thus, a multilayer laminate is produced, in which an insulation layer is constituted with a base and a cured product of a thermosetting resin composition between the inner layer circuit and the metal foil for an outer layer circuit. Next, a processing for forming a hole, such as a through-hole and a via hole, is conducted on the multilayer laminate, and then a desmearing treatment for removing a smear, which is resin debris originated from a resin component contained in a cured product layer, is performed. Then a plated metal film for connecting electrically the inner layer circuit and the metal foil for an outer layer circuit is formed on a wall surface of the hole, and further an outer layer circuit is formed by conducting various circuit forming steps such as an etching treatment on the metal foil for an outer layer circuit to complete a printed wiring board.

The prepreg of the present Embodiment and a resin composition layer of a metal foil-clad laminate (a layer composed of the prepreg of the present Embodiment) constitute an insulation layer.

Meanwhile, the prepreg and/or a metal foil-clad laminate of the present Embodiment is also suitable for an application of a component embedded multilayer printed wiring board. The term "component embedded multilayer printed wiring board" may be obtained by processing a hollow, or a hole in a laminate made separately, placing therein a component for an electronic device, laying 1 or more sheets of prepreg including the aforedescribed prepreg thereon, and applying heat and pressure thereto. Specifically, such a board can be produced by the following method. On to a subsidiary material (for example, a stainless steel plate, or an aluminum coated steel sheet), a laminate (in which an inner layer circuit may be formed) with a fabricated hollow or hole, in which a component for an electronic device (for example, a component, such as a memory, an IC chip, and a capacitor; and a metal foil circuit formed on a stainless steel plate, etc.) is placed, at least one sheet of the prepreg is layered, and, if necessary, a metal foil is placed to form a constitution with the foil on a single face or both faces. The stack is then hot-pressed to complete a laminate. For hot-pressing, for example, a multistage press, a multistage vacuum press, a continuous molding machine, and an autoclave molding machine may be used, and generally a temperature range is from 100 to 300° C., a pressure range is from 2 to 100 kgf/cm$^2$, and a heating time range is from 0.05 to 5 hours. In this case, if required, a part of the prepreg, at a location where a component is placed, may be cut off or perforated, such that grounding between the placed component and the glass cloth constituting the prepreg can be avoided.

EXAMPLES

The present Embodiment will be described in detail below by way of Examples and Comparative Examples, provided that the present Embodiment be not limited thereto in any way.

Varnish Production Example 1

Firstly, 35 parts by mass of an α-naphthol aralkyl-based cyanic acid ester compound (cyanate equivalent: 261 g/eq.), which is obtained by the production method according to Japanese Patent No. 4407823, and has hydrogen atoms for all of $R_1$ in the formula (1), 15 parts by mass of bis(3-ethyl-5-methyl-maleimidophenyl)methane (BMI-70, produced by K.I Chemical Industry Co., Ltd.), and 50 parts by mass of a phenol biphenyl aralkyl-based epoxy resin (NC-3000-FH, epoxy equivalent: 320 g/eq., produced by Nippon Kayaku Co., Ltd.) were mixed and dissolved in methyl ethyl ketone. Then, with the mixture, 2 parts by mass of a silane coupling agent (Z6040, produced by Dow Corning Toray Co., Ltd.), 2 parts by mass of a wetting and dispersing agent 1 (DISPERBYK-161, produced by BYK Japan KK), 130 parts by mass of spherical fused silica (SC2050 MB, produced by Admatechs Co., Ltd.), 15 parts by mass of a silicone rubber powder, which surface was coated with a silicone resin (KMP-600, produced by Shin-Etsu Chemical Co., Ltd.), 10 parts by mass of a silicone resin powder (TOSPEARL 120, produced by Momentive Performance Materials Japan LLC), and 0.02 part by mass of zinc octoate (produced by Nihon Kagaku Sangyo Co., Ltd.) were mixed to obtain a varnish.

Varnish Production Example 2

Firstly, 36 parts by mass of an α-naphthol aralkyl-based cyanic acid ester compound used in varnish production example 1, 26 parts by mass of a maleimide compound in which $R_3$ in the formula (3) are all hydrogen atoms (BMI-2300, produced by Daiwakasei Industry Co., Ltd.), 38 parts by mass of a polyoxynaphthylene-based epoxy resin (HP-6000, epoxy equivalent: 250 g/eq., produced by DIC Corporation) were mixed and dissolved in methyl ethyl ketone. Then, with the mixture, 1 part by mass of wetting and dispersing agent 1, 2 parts by mass of wetting and dispersing agent 2 (DISPERBYK-111, produced by BYK Japan KK), 5 parts by mass of a silane coupling agent (Z6040, produced by Dow Corning Toray Co., Ltd.), 220 parts by mass of spherical fused silica (SC2050MOB), 10 parts by mass of a silicone rubber powder, which surface was coated with a silicone resin (KMP-600), and 1 part by mass of 2,4,5-triphenylimidazole in which Ar and $R_{13}$ in the formula (11) are all phenyl groups (produced by Wako Pure Chemical Industries, Ltd.) were mixed to obtain a varnish.

Example 1

Using glass yarns having twisted respectively 40 filaments with an average filament diameter of 4.1 μm as a warp yarn and a weft yarn, the glass cloth of a plain weave was woven by an air jet loom at a weaving density of 95 warps per inch and 95 wefts per inch. Each glass cloth below was woven by the same method.

To the glass cloth obtained as above having a mass per unit area of 10.5 (g/m$^2$), and a thickness of 13 (μm), wherein a warp yarn constituting the glass cloth was composed of 40 filaments and a weft yarn constituting the glass cloth was composed of 40 filaments, the filaments having an average diameter of 4.1 (μm), and the number of warp yarns per inch was 95 (threads/inch) and the number of weft yarns per inch was 95 (threads/inch), the varnish obtained in varnish production example 1 after dilution with methyl ethyl ketone to a solid content of the thermosetting resin composition of 70% was applied by impregnation, and followed by drying with heating at 160° C. for 4 min to obtain a prepreg having a volume content of the glass cloth of 24% by volume.

Example 2

A prepreg having a volume content of a glass cloth of 28% by volume was obtained identically with Example 1.

Example 3

To a glass cloth having a mass per unit area of 10.8 (g/m$^2$), and a thickness of 13 (μm), wherein a warp yarn constituting the glass cloth was composed of 40 filaments and a weft yarn constituting the glass cloth was composed of 50 filaments, the filaments having an average diameter of 4.1 (μm), and the number of warp yarns per inch was 95 (threads/inch) and the number of weft yarns per inch was 85 (threads/inch), the varnish obtained in varnish production example 1 after dilution with methyl ethyl ketone to a solid content of a thermosetting resin composition of 70% was applied by impregnation, and followed by drying with heating at 160° C. for 4 min to obtain a prepreg having a volume content of the glass cloth of 24% by volume.

Example 4

A prepreg having a volume content of a glass cloth of 28% by volume was obtained identically with Example 3.

Example 5

To a glass cloth having a mass per unit area of 11.4 (g/m$^2$), and a thickness of 14 (μm), wherein a warp yarn constituting the glass cloth was composed of 40 filaments and a weft yarn constituting the glass cloth was composed of 50 filaments, the filaments having an average diameter of 4.1 (μm), and the number of warp yarns per inch was 95 (threads/inch) and the number of weft yarns per inch was 95 (threads/inch), the varnish obtained in varnish production example 1 after dilution with methyl ethyl ketone to a solid content of a thermosetting resin composition of 70% was applied by impregnation, and followed by drying with heating at 160° C. for 4 min to obtain a prepreg having a volume content of the glass cloth of 25% by volume.

Example 6

To a glass cloth having a mass per unit area of 9.8 (g/m$^2$), and a thickness of 11 (μm), wherein a warp yarn constituting the glass cloth was composed of 40 filaments and a weft yarn constituting the glass cloth was composed of 40 filaments, the filaments having an average diameter of 4.1 (μm), and the number of warp yarns per inch was 95 (threads/inch) and the number of weft yarns per inch was 85 (threads/inch), the varnish obtained in varnish production example 1 after dilution with methyl ethyl ketone to a solid content of a thermosetting resin composition of 70% was applied by impregnation, and followed by drying with heating at 160° C. for 4 min to obtain a prepreg having a volume content of the glass cloth of 23% by volume.

Example 7

To a glass cloth having a mass per unit area of 10.5 (g/m$^2$), and a thickness of 13 (μm), wherein a warp yarn constituting the glass cloth was composed of 40 filaments and a weft yarn constituting the glass cloth was composed of 40 filaments, the filaments having an average diameter of 4.1 (μm), and the number of warp yarns per inch was 95 (threads/inch) and the number of weft yarns per inch was 95 (threads/inch), the varnish obtained in varnish production example 2 after dilution with methyl ethyl ketone to a solid content of a thermosetting resin composition of 75% was applied by impregnation, and followed by drying with heating at 160° C. for 4 min to obtain a prepreg having a volume content of the glass cloth of 24% by volume.

Example 8

A prepreg having a volume content of a glass cloth of 28% by volume was obtained identically with Example 7.

Example 9

To a glass cloth having a mass per unit area of 10.8 (g/m$^2$), and a thickness of 13 (w), wherein a warp yarn constituting the glass cloth was composed of 40 filaments and a weft yarn constituting the glass cloth was composed of 50 filaments, the filaments having an average diameter of 4.1 (μm), and the number of warp yarns per inch was 95 (threads/inch) and the number of weft yarns per inch was 85 (threads/inch), the varnish obtained in varnish production example 2 after dilution with methyl ethyl ketone to a solid content of a thermosetting resin composition of 75% was applied by impregnation, and followed by drying with heating at 160° C. for 4 min to obtain a prepreg having a volume content of the glass cloth of 24% by volume.

Example 10

A prepreg having a volume content of a glass cloth of 28% by volume was obtained identically with Example 9.

Example 11

To a glass cloth having a mass per unit area of 11.4 (g/m$^2$), and a thickness of 14 (μm), wherein a warp yarn constituting the glass cloth was composed of 40 filaments and a weft yarn constituting the glass cloth was composed of 50 filaments, the filaments having an average diameter of 4.1 (μm), and the number of warp yarns per inch was 95 (threads/inch) and the number of weft yarns per inch was 95 (threads/inch), the varnish obtained in varnish production example 2 after dilution with methyl ethyl ketone to a solid content of a thermosetting resin composition of 75% was applied by impregnation, and followed by drying with heating at 160° C. for 4 min to obtain a prepreg having a volume content of the glass cloth of 25% by volume.

Example 12

To a glass cloth having a mass per unit area of 9.8 (g/m$^2$), and a thickness of 11 (μm), wherein a warp yarn constituting the glass cloth was composed of 40 filaments and a weft yarn constituting the glass cloth was composed of 40 filaments, the filaments having an average diameter of 4.1 (μm), and the number of warp yarns per inch was 95 (threads/inch) and the number of weft yarns per inch was 85 (threads/inch), the varnish obtained in varnish production example 2 after dilution with methyl ethyl ketone to a solid content of a thermosetting resin composition of 75% was applied by impregnation, and followed by drying with heating at 160° C. for 4 min to obtain a prepreg having a volume content of the glass cloth of 23% by volume.

Comparative Example 1

To a glass cloth having a mass per unit area of 12.5 (g/m²), and a thickness of 15 (μm), wherein a warp yarn constituting the glass cloth was composed of 50 filaments and a weft yarn constituting the glass cloth was composed of 50 filaments, the filaments having an average diameter of 4.1 (μm), and the number of warp yarns per inch was 95 (threads/inch) and the number of weft yarns per inch was 95 (threads/inch), the varnish obtained in varnish production example 1 after dilution with methyl ethyl ketone to a solid content of a thermosetting resin composition of 70% was applied by impregnation, and followed by drying with heating at 160° C. for 4 min to obtain a prepreg having a volume content of the glass cloth of 27% by volume.

Comparative Example 2

A prepreg having a volume content of a glass cloth of 33% by volume was obtained identically with Comparative Example 1.

Comparative Example 3

To a glass cloth having a mass per unit area of 12.5 (g/m²), and a thickness of 15 (μm), wherein a warp yarn constituting the glass cloth was composed of 50 filaments and a weft yarn constituting the glass cloth was composed of 50 filaments, the filaments having an average diameter of 4.1 (μm), and the number of warp yarns per inch was 95 (threads/inch) and the number of weft yarns per inch was 95 (threads/inch), the varnish obtained in varnish production example 2 after dilution with methyl ethyl ketone to a solid content of a thermosetting resin composition of 70% was applied by impregnation, and followed by drying with heating at 160° C. for 4 min to obtain a prepreg having a volume content of the glass cloth of 27% by volume.

Comparative Example 4

A prepreg having a volume content of a glass cloth of 33% by volume was obtained identically with Comparative Example 3.

Comparative Example 5

To a glass cloth having a mass per unit area of 11.2 (g/m²), and a thickness of 13 (w), wherein a warp yarn constituting the glass cloth was composed of 50 filaments and a weft yarn constituting the glass cloth was composed of 50 filaments, the filaments having an average diameter of 4.1 (μm), and the number of warp yarns per inch was 85 (threads/inch) and the number of weft yarns per inch was 85 (threads/inch), the varnish obtained in varnish production example 1 after dilution with methyl ethyl ketone to a solid content of a thermosetting resin composition of 75% was applied by impregnation, and followed by drying with heating at 160° C. for 4 min to obtain a prepreg having a volume content of the glass cloth of 25% by volume.

Comparative Example 6

To a glass cloth having a mass per unit area of 11.2 (g/m²), and a thickness of 13 (μm), wherein a warp yarn constituting the glass cloth was composed of 50 filaments and a weft yarn constituting the glass cloth was composed of 50 filaments, the filaments having an average diameter of 4.1 (μm), and the number of warp yarns per inch was 85 (threads/inch) and the number of weft yarns per inch was 85 (threads/inch), the varnish obtained in varnish production example 2 after dilution with methyl ethyl ketone to a solid content of a thermosetting resin composition of 75% was applied by impregnation, and followed by drying with heating at 160° C. for 4 min to obtain a prepreg having a volume content of the glass cloth of 25% by volume.

Comparative Example 7

To a glass cloth having a mass per unit area of 10.0 (g/m²), and a thickness of 11 (μm), wherein a warp yarn constituting the glass cloth was composed of 50 filaments and a weft yarn constituting the glass cloth was composed of 50 filaments, the filaments having an average diameter of 4.1 (μm), and the number of warp yarns per inch was 75 (threads/inch) and the number of weft yarns per inch was 75 (threads/inch), the varnish obtained in varnish production example 1 after dilution with methyl ethyl ketone to a solid content of a thermosetting resin composition of 75% was applied by impregnation, and followed by drying with heating at 160° C. for 4 min to obtain a prepreg having a volume content of the glass cloth of 23% by volume.

Comparative Example 8

To a glass cloth having a mass per unit area of 10.0 (g/m²), and a thickness of 11 (μm), wherein a warp yarn constituting the glass cloth was composed of 50 filaments and a weft yarn constituting the glass cloth was composed of 50 filaments, the filaments having an average diameter of 4.1 (μm), and the number of warp yarns per inch was 75 (threads/inch) and the number of weft yarns per inch was 75 (threads/inch), the varnish obtained in varnish production example 2 after dilution with methyl ethyl ketone to a solid content of a thermosetting resin composition of 75% was applied by impregnation, and followed by drying with heating at 160° C. for 4 min to obtain a prepreg having a volume content of the glass cloth of 23% by volume.

TABLE 1

| | Example 1 | Example 2 | Example 3 | Example 4 | Example 5 | Example 6 |
|---|---|---|---|---|---|---|
| t | 13 | 13 | 13 | 13 | 14 | 11 |
| x | 40 | 40 | 40 | 40 | 40 | 40 |
| y | 40 | 40 | 50 | 50 | 50 | 40 |
| X | 95 | 95 | 95 | 95 | 95 | 95 |
| Y | 95 | 95 | 85 | 85 | 95 | 85 |
| r | 4.1 | 4.1 | 4.1 | 4.1 | 4.1 | 4.1 |
| W | 10.5 | 10.5 | 10.8 | 10.8 | 11.4 | 9.8 |
| (X + Y)/(x + y) | 2.4 | 2.4 | 2.0 | 2.0 | 2.1 | 2.3 |
| Coating test result | ○ | ○ | ○ | ○ | ○ | ○ |
| Press test result | ○ | ○ | ○ | ○ | ○ | ○ |

TABLE 1-continued

|  | | | | | | |
|---|---|---|---|---|---|---|
| Thickness of insulation layer (μm) | 16.8 | 14.9 | 17.1 | 15.2 | 17.2 | 16.9 |
| HAST test result | ○ | ○ | ○ | ○ | ○ | ○ |

|  | Example 7 | Example 8 | Example 9 | Example 10 | Example 11 | Example 12 |
|---|---|---|---|---|---|---|
| t | 13 | 13 | 13 | 13 | 14 | 11 |
| x | 40 | 40 | 40 | 40 | 40 | 40 |
| y | 40 | 40 | 50 | 50 | 50 | 40 |
| X | 95 | 95 | 95 | 95 | 95 | 95 |
| Y | 95 | 95 | 85 | 85 | 95 | 85 |
| r | 4.1 | 4.1 | 4.1 | 4.1 | 4.1 | 4.1 |
| W | 10.5 | 10.5 | 10.8 | 10.8 | 11.4 | 9.8 |
| (X + Y)/(x + y) | 2.4 | 2.4 | 2.0 | 2.0 | 2.1 | 2.3 |
| Coating test result | ○ | ○ | ○ | ○ | ○ | ○ |
| Press test result | ○ | ○ | ○ | ○ | ○ | ○ |
| Thickness of insulation layer (μm) | 16.9 | 15.1 | 17.0 | 15.0 | 17.3 | 17.2 |
| HAST test result | ○ | ○ | ○ | ○ | ○ | ○ |

TABLE 2

|  | Comparative Example 1 | Comparative Example 2 | Comparative Example 3 | Comparative Example 4 |
|---|---|---|---|---|
| t | 15 | 15 | 15 | 15 |
| x | 50 | 50 | 50 | 50 |
| y | 50 | 50 | 50 | 50 |
| X | 95 | 95 | 95 | 95 |
| Y | 95 | 95 | 95 | 95 |
| r | 4.1 | 4.1 | 4.1 | 4.1 |
| W | 12.5 | 12.5 | 12.5 | 12.5 |
| (X + Y)/(x + y) | 1.9 | 1.9 | 1.9 | 1.9 |
| Coating test result | ○ | pinhole | ○ | pinhole |
| Press test result | abrasion | void | abrasion, void | void |
| Thickness of insulation layer (μm) | 16.9 | 15.3 | 17.4 | 15.2 |
| HAST test result | Δ | X | Δ | X |

|  | Comparative Example 5 | Comparative Example 6 | Comparative Example 7 | Comparative Example 8 |
|---|---|---|---|---|
| t | 13 | 13 | 11 | 11 |
| x | 50 | 50 | 50 | 50 |
| y | 50 | 50 | 50 | 50 |
| X | 85 | 85 | 75 | 75 |
| Y | 85 | 85 | 75 | 75 |
| r | 4.1 | 4.1 | 4.1 | 4.1 |
| W | 11.2 | 11.2 | 10.0 | 10.0 |
| (X + Y)/(x + y) | 1.7 | 1.7 | 1.5 | 1.5 |
| Coating test result | pinhole | pinhole | pinhole | pinhole |
| Press test result | void | void | void | void |
| Thickness of insulation layer (μm) | 17.1 | 16.8 | 17.0 | 17.1 |
| HAST test result | Δ | X | X | X |

[Coating Test]

As a coating test, a varnish was coated by impregnation on a glass cloth and dried at 160° C. for 4 min. The appearance of an obtained prepreg was inspected. In this regard, a prepreg having neither wet speck nor pinhole was rated as ○. The term "Wet speck" means a state in which repellence occurs due to difference in surface tension between a resin and a glass cloth, or an influence of contamination with a dirt. The term "Pinhole" means a void not filled with a thermosetting resin composition appeared in a vacant space at a cross point of a warp yarn and a weft yarn constituting a glass cloth.

[Press Test]

As a press test, 3 μm ultra-thin copper foils with a carrier film (MT18E×3 μm, produced by Mitsui Mining & Smelting Co., Ltd.) were layered on an upper layer and a lower face of an obtained prepreg and heat-molded at 230° C. and 30 kg/cm² for 120 min to yield a laminate. The laminate was etched out, and the exposed appearance was inspected. In this regard, the appearance without void or abrasion was rated as ○. The term "Void" means an appeared void absent from a glass cloth and a cured resin product, when a laminate is etched out. The term "Abrasion" means a state in which a yarn of a glass cloth is exposed to a surface, when a laminate is etched out.

[HAST Test]

As a HAST test (insulation reliability test), 3 μm ultra-thin copper foils with a carrier film (MT18E×3 μm, produced by Mitsui Mining & Smelting Co., Ltd.) were layered on an upper face and a lower face of an obtained prepreg and heat-molded at 230° C. and 30 kg/cm² for 120 min to yield a laminate. The copper foil of the laminate was removed by etching except a central part of the copper foils, and to the remaining copper foils, which were used as electrode connecting parts, a voltage of 5 V was applied under a moist heat condition of 135° C. and 85%, followed by measurements of resistance values in the volume direction. The evaluations were conducted at 5 positions on a laminate after an elapse of 300 hours, and if the resistance values were $1\times10^8$ or more (Ω) at all of 5 positions, it was rated as ○; if the values were $1\times10^8$ or more (Ω) at 3 to 4 positions, it was rated as A; and if the values were $1\times10^8$ or more (Ω) at 0 to 2 positions, it was rated as X.

This application is based on Japanese Patent Application No. 2013-186307 filed with Japan Patent Office on 9 Sep. 2013, and Japanese Patent Application No. 2014-028381 filed with Japan Patent Office on 18 Feb. 2014, the entire contents of which are incorporated herein by reference.

The invention claimed is:

1. A prepreg comprising:
a thermosetting resin composition (C) comprising a thermosetting resin (A), and an inorganic filler (B); and
a glass cloth (D) impregnated or coated with the thermosetting resin composition (C);
wherein the glass cloth (D) satisfies the following expressions (I) to (VI), $$(x+y) \leq 95 \tag{I}$$

$$1.9 < (X+Y)/(x+y) \tag{II}$$

$$t \leq 14 \tag{III}$$

$$X \text{ is from 80 to 105} \tag{IV}$$

$$Y \text{ is 80 or more} \tag{V}$$

$$X:Y \text{ is from 0.85:1 to 1.15:1} \tag{VI}$$

wherein the glass cloth (D) is defined by X representing number of warp yarn per inch; Y representing number of weft yarn per inch; x representing number of filament per the warp yarn; y representing number of filament per the weft yarn; and t (μm) representing the thickness of the cloth, and wherein a content of the inorganic filler (B) in the thermosetting resin composition (C) is from 110 to 700 parts by mass based on 100 parts by mass of the thermosetting resin (A), and wherein an average value of the average filament diameter r (μm) of the warp yarn and the weft yarn is from 2.5 to 4.5 μm.

2. The prepreg according to claim 1, wherein the content of the inorganic filler (B) is from 38 to 88 parts by mass based on 100 parts by mass of the thermosetting resin composition (C).

3. The prepreg according to claim 1, wherein the value of x+y in the glass cloth (D) is 50 or more.

4. The prepreg according to claim 1, wherein the value of (X+Y)/(x+y) in the glass cloth (D) is 7.0 or less.

5. The prepreg according to claim 1, wherein the thickness t (μm) of the glass cloth (D) is 8 μm or more.

6. The prepreg according to claim 1, wherein when r (μm) represents an average filament diameter of the warp yarn and the weft yarn, the thickness t (μm) of the glass cloth (D) is less than 4r.

7. The prepreg according to claim 1, wherein the value of X/Y of the glass cloth (D) is from 0.85 to 1.15.

8. The prepreg according to claim 1, wherein when W (g/m$^2$) represents a mass per unit area of the glass cloth (D), the value of W/t (g/μm·m$^2$) is less than 1.0.

9. The prepreg according to claim 1, wherein the thermosetting resin (A) comprises a cyanic acid ester compound and/or a maleimide compound.

10. The prepreg according to claim 1, wherein the thermosetting resin (A) comprises a bismaleimide triazine resin.

11. The prepreg according to claim 1, wherein the volume content of the glass cloth (D) in the prepreg is from 21% by volume to 35% by volume.

12. The prepreg according to claim 1, wherein the inorganic filler (B) comprises one or more selected from the group consisting of silica, boehmite, and alumina.

13. A metal foil-clad laminate comprising the prepreg according to claim 1, and a metal foil laminated on a single face or both faces of the prepreg.

14. A printed wiring board made by using the prepreg according to claim 1 as a build-up material.

15. A multilayer printed wiring board made by using the metal foil-clad laminate according to claim 13 as a lamination material.

16. A component embedded multilayer printed wiring board obtained by using the prepreg according to claim 1 as a build-up material, and placing a component for a semiconductor use and a wiring pattern on a base layer on the prepreg.

17. A printed wiring board made by using the prepreg according to claim 1 as an insulation layer.

* * * * *